United States Patent [19]

Härer et al.

[11] 4,275,351
[45] Jun. 23, 1981

[54] ARRANGEMENT FOR MONITORING BATTERIES

[75] Inventors: Helmut Härer, Remseck; Josef Juhasz, Vaihingen/Enz-Rosswag, both of Fed. Rep. of Germany

[73] Assignee: Robert Bosch GmbH, Stuttgart, Fed. Rep. of Germany

[21] Appl. No.: 2,683

[22] Filed: Jan. 11, 1979

[30] Foreign Application Priority Data

Jan. 11, 1978 [DE] Fed. Rep. of Germany ....... 2801027

[51] Int. Cl.³ ............................................ G01N 27/42
[52] U.S. Cl. .................................... 324/427; 324/429
[58] Field of Search ............... 324/426, 427, 429, 431, 324/425, 428, 433–435, 100, 153, 126, 125, 111, 113, 110

[56] References Cited

U.S. PATENT DOCUMENTS

| 2,392,737 | 1/1946 | Heyer | 324/431 |
|---|---|---|---|
| 3,387,198 | 6/1968 | Johnson et al. | 324/426 |
| 3,969,667 | 7/1976 | McWilliams | 324/427 |
| 4,080,560 | 3/1978 | Abert | 324/429 |
| 4,104,580 | 8/1978 | Juhasz | 324/429 |

Primary Examiner—Michael J. Tokar
Attorney, Agent, or Firm—Michael J. Striker

[57] ABSTRACT

A battery-condition monitoring operation is performed by connecting a load resistor across the battery terminals for a time interval to draw a definite battery discharge current. A metering unit measures the voltage across the load resistor or that directly across the terminals of the battery. A timing switch sensible to the temperature of the load resistor automatically terminates the time interval, and a start switch is pressed to initiate the time interval; alternatively, the timing switch automatically initiates the measurement at successive time intervals. Latest at the end of the time interval, an arresting device prevents the metering unit from responding further to the metered signal, and the value most recently metered by the metering unit is persistently held, until the next such measurement operation, and constitutes an indication of the remaining capacity of the battery.

14 Claims, 5 Drawing Figures

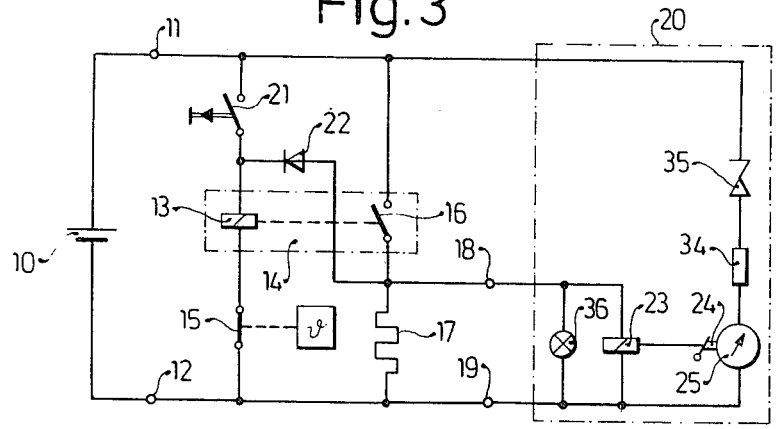
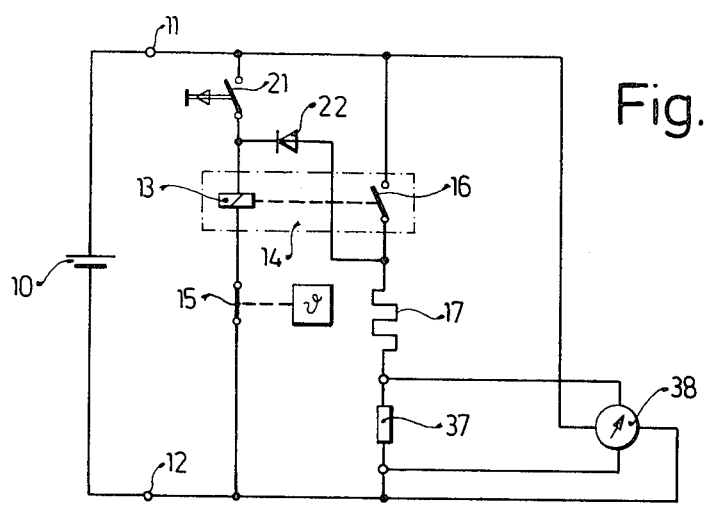
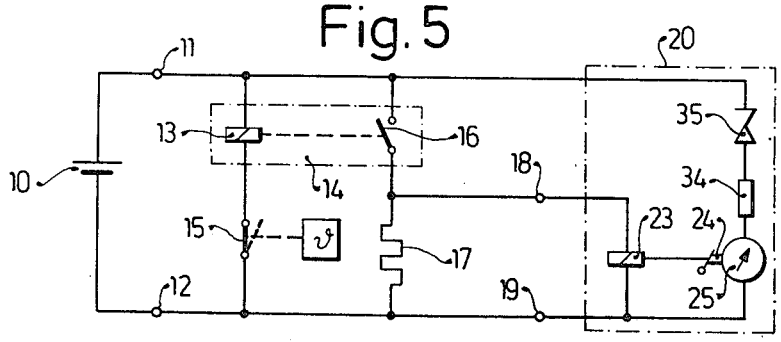

ARRANGEMENT FOR MONITORING BATTERIES

BACKGROUND OF THE INVENTION

The present invention relates to arrangements which monitor the condition of a battery, especially for example those which ascertain the remaining capacity of the battery in an electrically powered vehicle. More specifically, the invention concerns monitoring arrangements of this type which in particular comprise a measuring means connectable to the battery terminals and means for causing the measuring means to persistently hold a measured value.

Such arrangements are already known, in which a voltage-measuring device connectable across the battery terminals is controlled by a control unit. The control unit enables the voltage-measuring device to respond to an input voltage when the control unit itself senses the flow of a typical load current for the battery, whereupon the voltage-measuring device responds to or registers the input voltage applied to it, this then constituting the reading. For what they are intended to do, such monitoring arrangements operate satisfactorily. However, with them, a measuring operation is performed only when a typical battery load current value is sensed, which is not always encountered, i.e., so that it is not at any given time possible to initiate such a measuring or monitoring operation. Also, to a certain extent such monitoring arrangements can be considered to exhibit a disadvantage in that the loading of the battery with a typical load current for monitoring purposes is left undefined with respect to its duration in time, i.e., for the purposes of the measuring operation to be performed.

SUMMARY OF THE INVENTION

It is one object of the invention to provide a battery monitoring arrangement of the type in question, but of such a basic design that a monitoring or measuring operation can be initiated at any given time, so that for example if measuring operations are to be initiated by pressing a start switch or the like a monitoring operation will in fact each time be performed. Also, it is an object of the invention to provide such an arrangement in which the monitoring or measuring operation involves drawing a certain current from the battery for a definite length of time. This can lead to simpler performance of the measuring operation and to improvements in measuring accuracy per se.

In the presently preferred embodiments of the invention, use is made of a load resistor which is connected to the battery terminals for a certain length of time by means of a timing switch which is sensitive to the temperature of the load resistor, a definite discharge current flowing through such load resistor during this length of time. A holding means, normally operative for causing the measuring unit of the arrangement to hold the most recently measured value, is activated upon elapse of the time interval in question so that the input signal most recently applied to the measuring unit is registered, held and indicated and serves to constitute a measure of the still remaining capacity of the battery.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

BRIEF DESCRIPTION OF THE DRAWINGS

FIGS. 3-5 depict three further exemplary embodiments of the invention.

DESCRIPTION OF THE PREFERRED EMBODIMENTS

Figure 1:
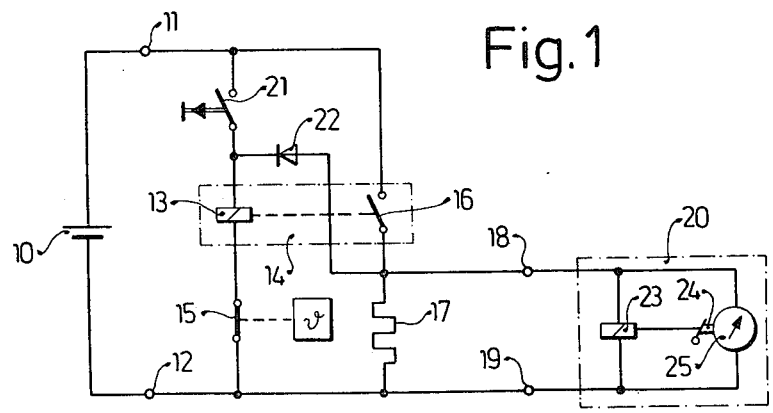
FIG. 1 depicts a first exemplary embodiment of the inventive battery monitoring arrangement.

In FIG. 1, numeral 10 denotes a battery having terminals 11, 12. Connected to terminal 11 is the first contact of a start switch 21, whose other contact is connected to one terminal of the winding 13 of a relay-type auxiliary switch 14. Connected in series with winding 13 is a normally-closed switch 15 of bimetallic design. Connected across the two battery terminals 11, 12 is a circuit branch including a normally-open switch 16 which closes when winding 13 is energized and a load resistor 17. Connected to the junction between the normally-open switch 16 and the load resistor 17 is the anode of a diode 22, whose cathode is connected to the junction between start switch 21 and the winding 13 of auxiliary switch 14.

The load resistor 17 is connected to terminals 18, 19 across which is connected a measuring unit 20. The measuring unit 20, which will be described below with regard to FIG. 2, includes an electromagnet 23 which activates a brake serving to arrest and release the mechanism of the measuring unit 20.

The operation of the illustrated circuit arrangement is as follows: When start switch 21 is activated, a measuring operation is initiated. If start switch 21 is in closed setting, then current flows from battery 10 via terminal 11, the start switch 21, the winding 13 of auxiliary switch 14 and via the normally-closed switch 15 to battery terminal 12. The flow of this current through winding 13 of auxiliary switch 14 closes normally-open switch 16 and a self-holding action sets in by means of diode 22 so that, even if pushbutton switch 21 is let go of, normally-open switch 16 will remain closed. A definite current now flows through the switch 16 and the load resistor 17. Load resistor 17 heats up, due to the flow of current through it, and the heat generated by resistor 17 is thermally transmitted to the bimetallic-type normally-closed switch 15. After a certain interval of time, bimetallic-type switch 15 opens, thereby interrupting the flow of current through the winding 13 of auxiliary switch 14, as a result of which switch 16 reassumes its open setting and the current flow through the load resistor 17 is discontinued.

During the time such current is flowing through load resistor 17 current likewise flows through the electromagnet 23 connected to terminals 18, 19. With electromagnet 23 thusly energized, the arresting means 24 for the measuring unit 25 is released, so that measuring unit 25 can react to and indicate the voltage across the two battery terminals 11, 12. At the instant in which the switch 16 opens to discontinue the current flowing through load resistor 17, the current flow through electromagnet 23 is likewise interrupted whereupon the arresting means 24 locks the measuring unit 25 in its most recently assumed setting, i.e., so that measuring unit 25 now registers and stores the most recently measured battery-terminal voltage value. This measured and held value forms a very accurate measure of the state of charge or remaining capacity of the battery 10.

Figure 2:
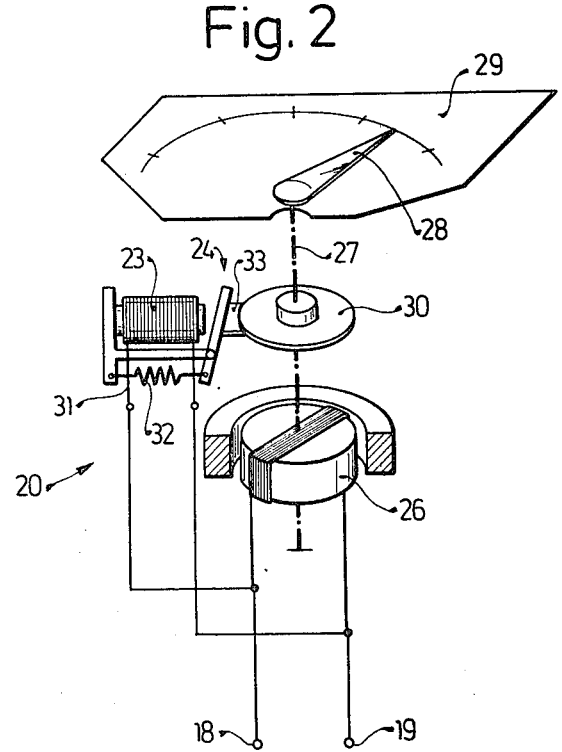
FIG. 2 depicts a measuring mechanism that can be used in the embodiment of FIG. 1.

FIG. 2 depicts the measuring unit 20 in greater detail. Measuring unit 20 here comprises a rotary-coil measuring mechanism 26. The electrical quantity to be measured is present at the terminals 18, 19, to which the winding of the rotary-coil measuring mechanism 26 is connected. The rotary-coil measuring mechanism 26 includes a rotary shaft 27 on which is carried a pointer 28 which sweeps across a calibrated scale 29. A brake disk 30 is mounted on rotary shaft 27, and the arresting means 24 cooperates therewith. The arresting means 24 is in turn associated with the electromagnet 23, whose coil 31 is likewise connected across the terminals 18, 19. The arresting means 24 is designed as the moving armature of the electromagnet 23 and is movable against the pull of a tension spring 32. When the coil 31 of electromagnet 23 is unenergized, the arresting means 24 presses via a brake pad 33 against the brake disk 30 and thereby arrests rotary shaft 27 against further rotation.

If a voltage is present across the terminals 18, 19 of the measuring unit, then current will flow through the coil 31 of the electromagnet 23 and the arresting means 24 via the brake pad 33 will release the brake disk 33, so that the voltage across the terminals of battery 10 can be measured. As soon as the load current through load resistor 17 has been discontinued, the coil 31 of electromagnet 23 deenergizes, the arresting means 24 engages the brake disk 30 and prevents further rotation of rotary shaft 27, so that the most recently indicated value will now be registered or stored by the measuring mechanism 25 and can be read off even after the measurement signal applied to terminals 18, 19 is removed.

FIG. 3 depicts a second exemplary embodiment of the invention. The embodiment of FIG. 3 is in principle the same as that of FIG. 1, and likewise its operation is substantially the same. In FIG. 3, however, the measuring mechanism 25 is connected, via a current-limiting or biasing resistor 34 and a zener diode 35, directly to the terminal 11 of the battery, whereas the electromagnet 23 continues to be connected to the junction between the normally-open switch 16 and the load resistor 17. With this circuit, the effects of aging of switch 16, e.g., increases in the contact resistance of switch 16, can be precluded. As before, electromagnet 23 is deenergized when the switch 16 opens and is energized when current flows through switch 16 and load resistor 17. However, in contrast to FIG. 1, the voltage across the terminals of battery 10 is directly picked off and not transmitted via the switch 16 and the auxiliary switch 14.

In the embodiment depicted in FIG. 3, an indicating arrangement 36, which at its simplest can be, as shown, a light-emitting diode, is connected in parallel to the electromagnet 23 and its illuminated and unilluminated states serve to indicate the fact that a measuring operation or a pause intermediate measuring operations is occurring. Instead of the electrical indicating arrangement shown at 36, use could also be made of a mechanical indicating arrangement constituted by having the arresting means 24, which serves as the armature of electromagnet 23, so arranged that a part of it is visible exteriorly of the housing of the measuring arrangement, i.e., so that the position of the armature 24 itself, or of an indicating element provided thereon, would itself serve to indicate whether a measuring operation or a pause intermediate measuring operations is occurring.

FIG. 4 depicts an embodiment for monitoring the state of charge of a battery, which in its circuit configuration is basically similar to that of FIG. 1. Connected in series with load resistor 17 is a measuring resistor 37. When current flows through the load resistor 17, then the voltage drop across measuring resistor 37 serves to release an auxiliary measuring arrangement within the measuring unit 38, in response to which the main measuring means within measuring unit 38 thereupon indicates the voltage across the terminals of battery 10. In other respects, the operation of this embodiment would be substantially the same as the embodiments of FIGS. 1 and 3. The measuring unit 38 of FIG. 3 could, for example, be of the type disclosed in Federal Republic of Germany published patent application DE-OS No. 25 45 086.

For certain practical applications it is advantageous that the battery capacity be automatically measured at certain time intervals. The invention contemplates doing this, for example, by having the start switch 21 of the embodiments of FIGS. 1, 3 and 4 automatically closed by a timer, e.g., a timer operative for briefly closing start switch 21 after the elapse of each successive 15-minute-long time interval. In response to each such brief closing of start switch 21, a measuring operation such as described above would ensue, and the result of this measurement would be continuously indicated for the subsequent 15 minutes until the next such measuring operation is automatically triggered. Another way of accomplishing this is depicted in FIG. 5. The measuring unit 20 corresponds to that of FIG. 3. Connected across the terminals 11, 12 of the battery 10 is the winding 13 of the auxiliary switch 14 and, in series therewith, a normally-closed switch 15. Likewise connected across the terminals 11, 12 of the battery 10 is the series connection of the normally-open switch 16 and the load resistor 17. Inasmuch as switch 15 is normally closed, initially current will flow from the battery 10 through it and through winding 13 of auxiliary switch 14, as a result of which normally-open switch 16 closes, so that battery current will flow through load or measuring resistor 17. Load resistor 17 is, in this embodiment again, in thermally-conductive engagement with normally-closed switch 15, the latter being here again of bimetallic temperature-responsive type. After current has flowed through resistor 17 for a certain length of time and sufficiently heated the bimetallic, normally-closed switch 15, the latter opens, thereby terminating the measuring operation. The most recently indicated measured value is now registered and persistently held. Thereafter, the temperature-responsive switch 15 slowly returns to its normal, closed position, i.e., as it and the load resistor 17 gradually cool down, the time required for this to occur determining the length of the time interval between successive automatic measuring operations. When finally normally-closed switch 15 again closes, the next such measuring operation is initiated.

According to a further concept of the invention, there can be connected in parallel to the measuring unit, or equivalently across the battery terminals 11, 12, a warning means operative for issuing an acoustic and/or visual warning signal when the remaining capacity of the battery 10 has fallen below a certain minimum value.

It will be understood that each of the elements described above, or two or more together, may also find a useful application in other types of circuits and constructions, differing from the types described above.

While the invention has been illustrated and described as embodied in battery-condition monitoring arrangements wherein the measuring unit employed is of a particular type, e.g., involving a moving-coil instrument and where likewise the switches employed are electromechanical relay-type switches, it is not intended to be limited to the details shown, since various modifications and structural changes may be made without departing in any way from the spirit of the present invention.

Without further analysis, the foregoing will so fully reveal the gist of the present invention that others can by applying current knowledge readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. An arrangement for monitoring batteries, particularly for ascertaining the remaining capacity of batteries for electrical vehicles, comprising, in combination, two battery-connection terminals for connection to a battery; electrical metering means having electrical input means for receipt of an electrical signal to be metered; load resistor means; connecting means for connecting said electrical input means in circuit with said battery-connection terminals, and including timing switch means operative when activated for connecting said load resistor means in circuit with said battery-connection terminals for a time interval to cause a definite discharge current to be drawn by said load resistor means from said battery connection terminals for said time interval, said timing switch means including temperature-responsive switch means responding to the heat generated by said load resistor means for terminating said time interval; and arresting means automatically operative at the end of said time interval for arresting the operation of said metering means and causing said metering means to persistently hold the value most recently metered by said metering means, this held metered value then serving as an indication of the remaining capacity of the battery.

2. The monitoring arrangement defined in claim 1, said temperature-responsive switch means of said connecting means having a first state, and having a second state which it assumes for terminating said predetermined time interval in response to the heat generated by said load resistor means, and slowly returning to said first state after said predetermined time interval, said temperature-responsive switch means of said connecting means being operative for connecting said load resistor means in circuit with said battery-connection terminals each time it assumes said first state and disconnecting the load resistor means each time it assumes said second state, whereby the metering operation is automatically and repeatedly performed at intervals dependent upon the time required for the temperature-responsive switch means to return from said second to said first state.

3. The monitoring arrangement defined in claim 1, said connecting means furthermore including start switch means and auxiliary switch means so connected to said battery-connection terminals, said load resistor means and said timing switch means that when said start switch means is activated said auxiliary switch means is rendered conductive to connect said load resistor means into circuit with said battery-connection terminals and then said timing switch means at the end of said predetermined time interval renders said auxiliary switch means non-conductive to disconnect said load resistor means from said battery-connection terminals.

4. The monitoring arrangement defined in claim 3, said timing switch means comprising temperature-responsive switch means responding to the heat generated by said load resistor means for terminating said predetermined time interval.

5. The monitoring arrangement defined in claim 3, said start switch means comprising a momentary switch, said auxiliary switch means comprising a normally-open relay switch and a cooperating relay winding which when energized closes said relay switch, said timing switch means comprising a normally-closed switch, said momentary switch, said relay winding and said normally-closed switch being connected together in series across said battery-connection terminals, said relay switch and said load resistor means being connected in series across said battery-connection terminals, and furthermore including a self-holding diode connected between one terminal of said relay switch and one terminal of said relay winding operative for keeping said winding energized and said relay switch closed in response to brief closing of said momentary switch even after said momentary switch opens.

6. The monitoring arrangement defined in claim 1, said metering means being electromechanical and said arresting means comprising an electromagnetic brake operative for mechanically arresting said electromechanical metering means.

7. The monitoring arrangement defined in claim 1, furthermore including a measuring resistor connected in series with the load resistor means, the measuring resistor developing a voltage drop when current flows through the load resistor means, said arresting means being connected to said measuring resistor and responding to said voltage drop.

8. The monitoring arrangement defined in claim 1, furthermore including indicating means operative for indicating whether or not said load resistor means is connected in circuit with said battery-connection terminals to thereby indicate whether a battery measurement is or is not occurring.

9. The monitoring arrangement defined in claim 3, furthermore including a timer operative for periodically activating said start switch means.

10. An arrangement for monitoring batteries, particularly for ascertaining the remaining capacity of batteries for electrical vehicles, comprising, in combination, two battery-connection terminals for connection to a battery; electrical metering means having electrical input means for receipt of an electrical signal to be metered; load resistor means; connecting means for connecting said electrical input means in circuit with said battery-connection terminals, and including timing switch means operative when activated for connecting said load resistor means in circuit with said battery-connection terminals for a predetermined time interval to cause a definite discharge current to be drawn by said load resistor means from said battery-connection terminals for said time interval; arresting means operative latest at the end of said time interval for arresting the operation of said metering means and causing said metering means to persistently hold the value most recently metered by said metering means, this held metered value then serving as an indication of the remaining capacity of the battery; said metering means being electromechanical and said arresting means comprising an electromagnetic brake operative for mechanically arresting said electromechanical metering means; and said electromechanical metering means being rotary and including a rotary shaft carrying a brake disk, said electromagnetic brake comprising an electromagnet having a coil and an armature and biasing means normally urging said armature to press against said brake disk and in that way arrest said metering means, said electromagnet when energized causing said armature to cease pressing against said brake disk.

11. The monitoring arrangement defined in claim 8, said connecting means furthermore including a normally-open relay switch and a cooperating relay winding which when energized closes said relay switch, said timing switch means comprising a normally-closed switch, said relay winding and said normally-closed switch being connected together in series across said battery-connection terminals, said relay switch and said load resistor means being connected together in series across said battery-connection terminals, said electrical input means of said metering means and said electromagnet of said arresting means both being connected to said battery-connection terminals through the intermediary of said relay switch.

12. The monitoring arrangement defined in claim 10, said connecting means furthermore including a normally-open relay switch and a cooperating relay winding which when energized closes said relay switch, said timing switch means comprising a normally-closed switch, said relay winding and said normally-closed switch being connected together in series across said battery-connection terminals, said relay switch and said load resistor means being connected together in series across said battery-connection terminals, said electromagnet of said arresting means being connected to said battery-connection terminals through the intermediary of said normally-open relay switch, said connecting means furthermore including permanent connecting means permanently connecting said electrical input means of said metering means to said battery-connection terminals.

13. The monitoring arrangement defined in claim 12, said permanent connecting means including a zener diode and a biasing resistor.

14. The monitoring arrangement defined in claim 10, said armature of said electromagnetic brake simultaneously serving as an indicator element indicating whether or not a battery measurement is or is not in the process of occurring.

* * * * *